(12) United States Patent
Tran et al.

(10) Patent No.: US 7,212,459 B2
(45) Date of Patent: May 1, 2007

(54) UNIFIED MULTILEVEL CELL MEMORY

(75) Inventors: Hieu Van Tran, San Jose, CA (US);
Hung Q. Nguyen, Fremont, CA (US);
Vishal Sarin, Santa Clara, CA (US);
Loc B. Hoang, San Jose, CA (US);
Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/126,495

(22) Filed: May 10, 2005

(65) Prior Publication Data

US 2005/0201151 A1   Sep. 15, 2005

Related U.S. Application Data

(62) Division of application No. 10/659,226, filed on Sep. 9, 2003.

(51) Int. Cl.
*G11C 7/02* (2006.01)
(52) U.S. Cl. .................. 365/207; 365/210; 365/189.07
(58) Field of Classification Search ................ 365/207, 365/210, 189.07
See application file for complete search history.

(56) References Cited

U.S. PATENT DOCUMENTS

| | | | |
|---|---|---|---|
| 4,051,354 A | 9/1977 | Choate | |
| 5,406,519 A | 4/1995 | Ha | |
| 5,469,382 A * | 11/1995 | Yero | 365/185.2 |
| 5,819,305 A | 10/1998 | Nixon | |
| 5,978,246 A | 11/1999 | Shindo | |
| 6,215,685 B1 | 4/2001 | Fung et al. | |
| 6,381,190 B1 | 4/2002 | Shinkai | |
| 6,518,817 B2 * | 2/2003 | Anderson et al. | 327/333 |
| 6,657,899 B2 | 12/2003 | Roohparvar | |
| 6,657,913 B2 | 12/2003 | Abedifard et al. | |
| 6,697,276 B1 | 2/2004 | Pereira et al. | |
| 6,707,725 B2 * | 3/2004 | Morikawa | 365/189.09 |
| 6,826,102 B2 * | 11/2004 | Baker | 365/207 |

* cited by examiner

*Primary Examiner*—David Lam
(74) *Attorney, Agent, or Firm*—DLA Piper US LLP

(57) ABSTRACT

A Unified Memory may store multiple types of content such as data or fast code or slow code. The data or code may be stored in separate arrays or in a common array. In an array, a tag bit may indicate the type of content such as data or fast code or slow code or single level or multilevel content. Tag bit may indicate communication interface or IO driver type. Sense amplifiers may be configurable based on the type of data being read. A Flash Security Measure is used to protect a protected memory area. A Flash Security Key is used for authentication and authorization a particular memory area. A XCAM (e.g., CAM) array is included in the Unified Memory. Unified Memory Concurrency is included.

7 Claims, 9 Drawing Sheets

UNIFIED MULTILEVEL CELL MEMORY

CROSS-REFERENCE TO RELATED APPLICATIONS

This application is a divisional application of U.S. patent application Ser. No. 10/659,226 filed on Sep. 9, 2003, the subject matter of which is incorporated herein by reference.

BACKGROUND OF THE INVENTION

The invention relates to a memory, and more particularly to a memory storing different types of content.

Code, such as operating systems, basic input/output systems (BIOS) or application software, is typically stored in a memory that allows fast random access and is typically read in small quantities, such as a few bytes at a time. In contrast, data, such as pictures, video or voice, is typically stored in memories having slow random access and is read in large quantities, such as in pages. For example, NOR flash memory is typically used for storing code, and NAND flash memory is typically used for storing data.

SUMMARY OF THE INVENTION

The invention provides a unified memory for storing multiple types of content, such as both data and code. In one aspect, a memory system may include a configurable sense amplifier for selective configuration based on the type of content being read, such as data or code. In another aspect, some single level memory cells and other memory cells may be multilevel memory cells.

In one aspect, the memory system may include a plurality of memory arrays. Different types of content may be stored in different memory arrays. Separate sense amplifiers may detect content in a corresponding memory array. In another aspect, a configurable sense amplifier may detect different types of content from a corresponding memory array. In yet another aspect, tag bits may be stored in a memory array to identify the type of content stored in the memory array. The configurable sense amplifier may be configured based on a tag bit to detect corresponding content.

DETAILED DESCRIPTION

A memory system is described in which memory arrays include subarrays that store different types of content, such as data or code, or in different formats, such as single level, multilevel or configurable level. Sense amplifiers are configurable to sense based on the content stored in the memory cells. Code may be stored in the memory and sensed using current or voltage mode sensing at high speed or high power. The code may be stored in a configurable number of bits per cell. Likewise data may be stored in the memory cell and sensed at low speed and low power using different sensing modes and configurable numbers of bits per cell. The size of the portion of memory arrays allocated by type of content may be configurable. Tag bits may be stored to indicate the type and format of content such as N×MLC (1× or 2× or 3× or 4×, with N× indicating $2^N$ level storage cell), fast code versus slow code, data or code, communication interface (such as USB or ATA), IO interface (such as CMOS or LVDS), and the like. A Flash Sector Key may be stored for each sector, by for example by tag bits or spare bits, and acts as a key to enable the access of the memory sector. The sector key is authenticated and authorized by a controlling circuit, for example in real time by the CAM (content addressable memory) array. A Flash Security Measure may be stored, by for example by tag bits or spare bits, for each sector (a sector including for example 8 rows of memory cells and 8K cells). A security measure ensures the security of a memory sector by key authentication and authorization. The sector may perform a self-destruction sequence for example by erasing and/or reprogramming after a certain attempt to break in. Different portions of memory may be accessed concurrently for the same or different operations on the same or different types of content.

Figure 1:
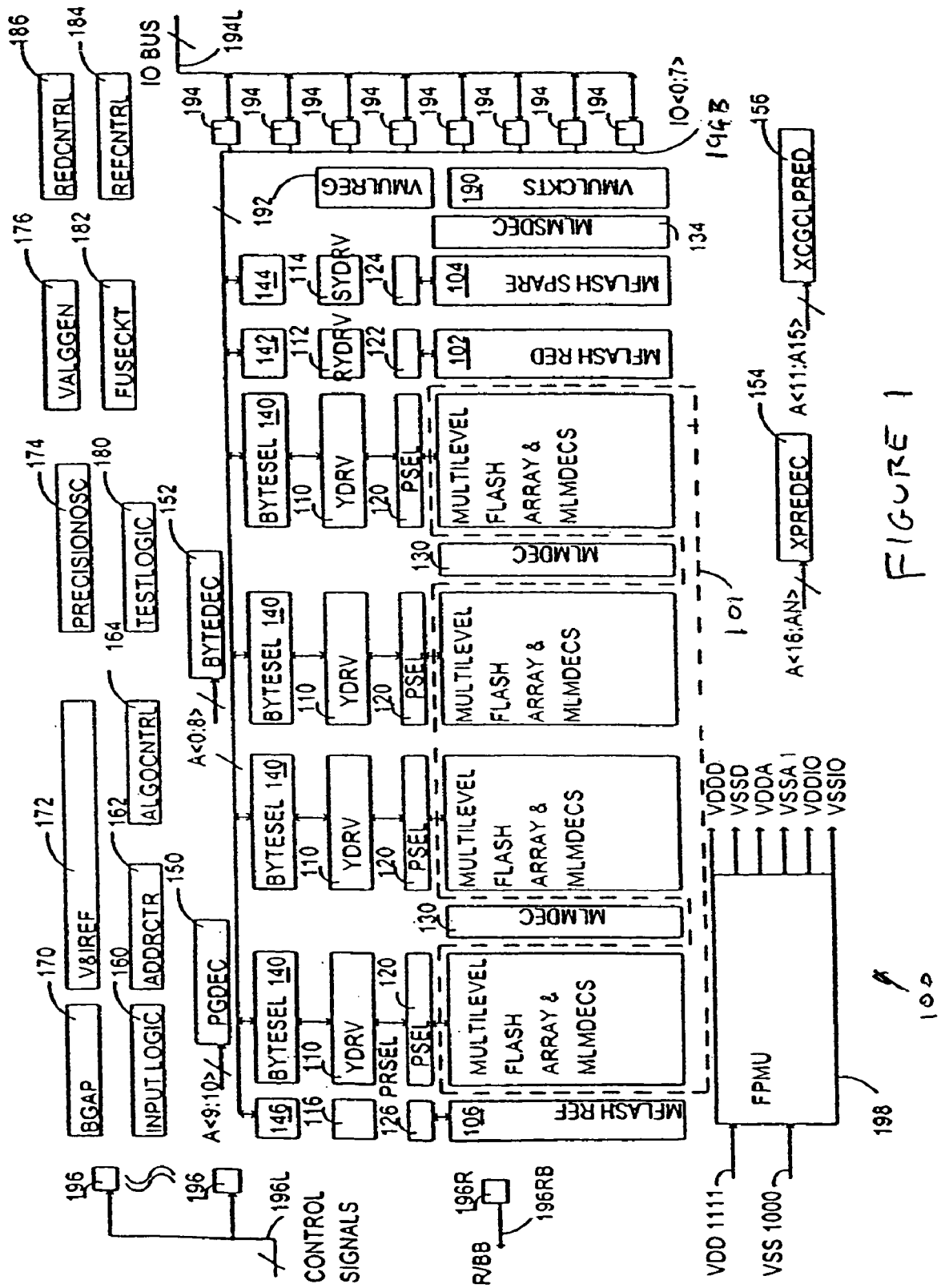
FIG. 1 is a block diagram illustrating a digital multilevel memory data storage system.

FIG. 1 is a block diagram illustrating a digital multilevel bit memory array system 100. For clarity, some signal lines of the memory array system 100 are not shown in FIG. 1.

In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101. In another embodiment, the regular memory arrays 01 may include reference memory cells for storing the reference voltage levels.

The redundancy array (MFLASHRED) 102 is used to increase production yield by replacing bad portions of the regular memory array 101.

The spare array (MFLASHSPARE) 104 may be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 110 or a total of 512 y-drivers 300.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 may be similar to that of the y-driver circuit 110.

The redundant y-driver circuit (RYDRV) 112 is used for the redundant array (MFLASHRED) 102. The function of redundant y-driver circuit (RYDRV) 112 may be similar to that of the y-driver circuit (YRDRV) 110.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 may be similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a redundant byte select circuit 142, a spare byte select circuit 144, a reference byte select circuit 146, a page address decoder (PGDEC) 150, a byte address decoder (BYTEDEC) 152, an address pre-decoding circuit (X PRE-DEC) 154, an address pre-decoding circuit (XCGCLPRE1) 156, an input interface logic (INPUTLOGIC) 160, and an address counter (ADDRCTR) 162.

The page select circuit (PSEL) 120 selects one bit line (not shown) out of multiple bitlines for each single y-driver (YDRV) 110. In one embodiment, the number of multiple bitlines connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the address counter 162 (described below) and provides precise multilevel bias values over temperature, process, and power supply used for consistent single level or multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The address pre-decoding circuit 154 decodes addresses. In one embodiment, the addresses are A<16:26> to select a block of memory array with one block comprising 16 rows. The outputs of the address pre-decoding circuit 154 are coupled to the block decoder 130 and the spare decoder 134. The address pre-decoding circuit 156 decodes addresses. In one embodiment, the addresses are addresses A<12:15> to select one row out of sixteen within a selected block. The outputs of address pre-decoding circuit 156 are coupled to the block decoder 130 and the spare decoder 134.

The page address decoder 150 decodes page addresses, such as A<9:11>, to select a page, e.g., P<0:7>, and provides its outputs to the page select circuits 120, 122, 124, and 126. The byte address decoder 152 decodes byte addresses, such as A<0:8>, and provides its outputs to the byte select circuit 140 to select a byte. The byte predecoder 152 also decodes spare byte address, such as A<0:3> and AEXT (extension address), and provides its outputs to the spare byte select circuit 144 to select a spare byte. A spare byte address control signal AEXT is used together with A<0:3> to decode addresses for the spare array 104 instead of the regular array 101.

The address counter (ADDRCTR) 162 provides addresses A<11:AN>, A<9:10>, and A<0:8> for row, page, and byte addresses, respectively. The outputs of the address counter (ADDRCTR) 162 are coupled to circuits 154, 156, 150, and 152. The inputs of the address counter (ADDRCTR) 162 are coupled from the outputs of the input interface logic (INPUTLOGIC) 160.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUTLOGIC) 160 to the external system microcontroller. The input interface logic circuit (INPUTLOGIC) 160 includes a status register that indicates the status of the memory chip operation such as pass or fail in program or erase, ready or busy, write protected or unprotected, cell margin good or bad, restore or no restore, and the like.

The digital multilevel bit memory array system 100 further includes an algorithm controller (ALGOCNTRL) 164, a band gap voltage generator (BGAP) 170, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VMULCKTS) 190, a voltage multiplexing regulator (VMULREG) 192, input/output (IO) buffers 194, and an input buffer 196.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. A bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system, and an input/output bus 194B, which couples to the arrays 101, 102, 104, and 106 through the y-drivers 110, 112, 114, and 116, respectively. In one embodiment, the input buffer 196 includes TTL input buffers or CMOS input buffers. In one embodiment, the input buffer 196 includes an output buffer with slew rate control or an output buffer with value feedback control. Input/output (IO) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/RB) 196RB.

The voltage supply and regulator (VMULCKT) 190 provides regulated voltage values above or below the external power supply used for erase, program, read, and production tests. In one embodiment, the voltage supply and regulator 190 includes a charge pump or a voltage multiplier. The voltage multiplying regulator (VMULREG) 192 provides regulation for the regulator 190 for power efficiency and for transistor reliability such as to avoid various breakdown mechanisms.

The system 100 may execute various operations on the memories 101, 102, 104, and 106. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Control signals (CONTROL SIGNALS) 196L, input/output bus (IO BUS) 194L, and ready busy signal (R/BB) 196RB are for communication with the system 100.

A flash power management circuit (FPMU) 198 manages power on-chip such as powering up only the circuit blocks in use. The flash power management circuit 198 also provides isolation between sensitive circuit blocks from the less sensitive circuit blocks by using different regulators for digital power (VDDD)/(VSSD), analog power (VDDA) (VSSA), and IO buffer power (VDDIO)/(VSSIO). The flash power management circuit 198 also provides better process reliability by stepping down power supply VDD to lower levels required by transistor oxide thickness. The flash power management circuit 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2:
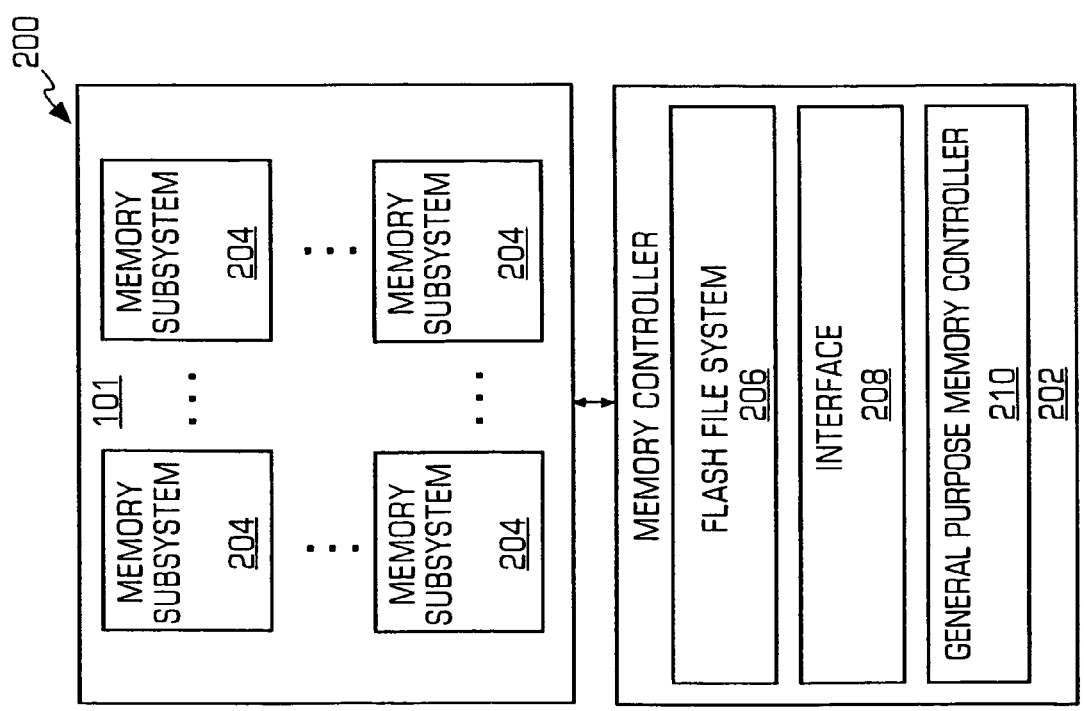
FIG. 2 is a block diagram illustrating a memory subsystem of one embodiment of the digital multilevel memory system of FIG. 1.

FIG. 2 is a block diagram illustrating a memory subsystem 200.

The memory subsystem 200 comprises a memory subarray 101 and a memory controller 202. In other embodiments the memory subsystem may include the redundant array 102, the spare array 104 and the reference array 106.

The memory subarray 101 comprises at least one memory subsystem 204. Although four memory arrays 204 are shown, the memory subarray 101 may comprise other numbers of memory arrays. In one embodiment, the memory array 101 comprises m rows of memory arrays and n columns of memory arrays for a total of m times n memory subsystems 204. The memory subsystem 204 may be the memory arrays of FIGS. 3–10, which are described below. Each memory subsystem 204 comprises at least one array of memory cells, at least one x decoder for selecting rows or portion of rows of the memory cells along word lines, at least one y decoder for selecting columns or portions of columns of memory cells along a bitline, and at least one sense amplifier for detecting the content of the selected memory cells. The memory cells may include redundant cells, reference cells or spare cells.

The memory controller 202 comprises a flash file system 206, an interface 208, and a general purpose memory controller 210. The general purpose memory controller 210 manages the general functions related to memory operation such as programming, erasing, reading, suspend operation, (program, erase, or read), concurrency (multiple operations such as read, program and erase are executed at the same time for different parts of the array), data scrambling, addressing, and the like. The general purpose memory controller 210 may handle internally production or screening memory testing on-chip. The flash file system 206 manages memory functions of the memory subarray 101 including defect management, wear leveling, memory mapping, error correction codes (ECC), redundancy and sector headers and other file management functions. The interface 208 controls the logic interface to the system 100 and external to the system 100. The interface 208 controls the interface compatibility depending on the type of interface such as universal serial bus (USB), advanced technology attachment (ATA), small computer system interface (SCSI), RAMBUS, serial or parallel, controls the input/output (IO) width, such as 8, 16, or 32 bit IO, and controls the type of IO driver, such as low voltage differential signaling (LVDS), high speed transceiver logic (HSTL), low voltage transistor-transistor logic (LVTTL) or complementary metal-oxide-silicon (CMOS). The interface 208 controls the interface between memory subarrays 101 or memory subsystems 204, which may store data, or code, and detects and processes a tag bit, security key or security measure (described below) for each memory to enable appropriate blocks or functions.

The memory subarray 204 may include status cells disposed in a separate row or rows or same row which indicates status of the subarray/row such as it is used for data or code storage, whether the subarray/row is at erase or program state, whether the subarray/row is good, not-so-good or bad condition, a number of bad cells in a subarray/row, or degree of cell storage level wearing, or operational status such as bias values for erase/program/read bias for each row or page, the number of erase cycles and/or number of program cycles that a subarray/row has been subjected to. The memory subarray 204 may include reference cells disposed in a separate row or rows or sector or bank, which are enabled when a data row is enabled in a verify or a read mode.

The memory subsystem 204 may include memory cells that are arranged in segmented arrays. In one embodiment, the memory cells of the segments are arranged in rows and columns. In one embodiment, the bitlines within a segmented array are isolated from another segmented array. In one embodiment, when operations are performed on a selected segmented array, all other segments are deselected. Some examples of segmented arrays are disclosed in U.S. Pat. No. 6,282,145, incorporated herein by reference above. The segments may have a size that is determined by the number of memory cells or by the dimensions of an array of memory cells, such as rows and columns.

Figure 3:
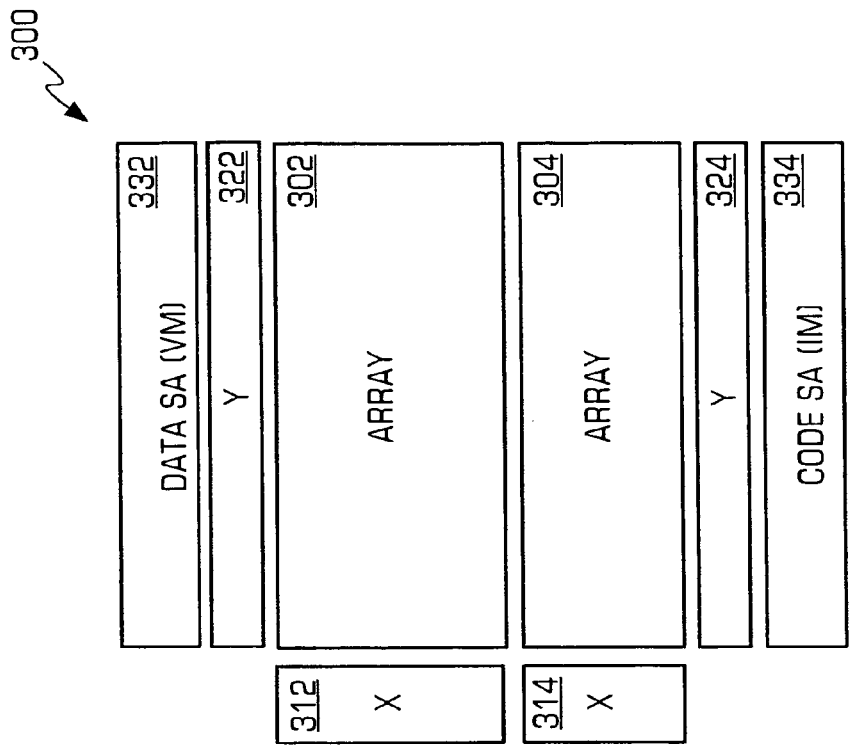
FIG. 3 is a block diagram illustrating a memory array including separate sensing for separate arrays.

FIG. 3 is a block diagram illustrating a memory array 300 including separate sensing for separate arrays.

The memory array 300 comprises a plurality of memory arrays 302 and 304, a plurality of x decoders 312 and 314, a plurality of y decoders 322 and 324 and a plurality of sense amplifiers 332 and 334. The sense amplifiers 332 and 334, respectively, detect the levels stored in selected ones of the memory cells of the respective arrays 302 and 304. In one embodiment, the memory arrays 302 and 304 store data and code, respectively, and the sense amplifiers 332 and 334 are data sense amplifiers and code sense amplifiers, respectively.

The separate arrays 302 and 304 are separately read by the data sense amplifier 332 and the code sense amplifier 334, respectively, and may read in different or same sensing modes. In one embodiment, the data sense amplifier 332 operates in a voltage sensing mode, and a code sense amplifier 334 operates in a current sensing mode. In another embodiment, the data sense amplifier 332 operates in a current sensing mode, and the code sense amplifier 334 operates in a current sensing mode. In another embodiment, the data sense amplifier 332 operates in a current sensing mode, and the code sense amplifier 334 operates in a voltage sensing mode. In another embodiment, the data sense amplifier 332 operates in a voltage sensing mode, and the code sense amplifier 334 operates in a voltage sensing mode.

The arrays 302 and 304 may have the memory cells therein arranged in segments. The size of the segments in the arrays 302 and 304 may be different depending on the content stored therein. For example, the array 302 may store data which tends to be slow to read and thus the segmentation of the array 302 may be small. In contrast, the array 304 may store code which requires fast reading, and therefore the array 304 may have small segments.

Figure 4:
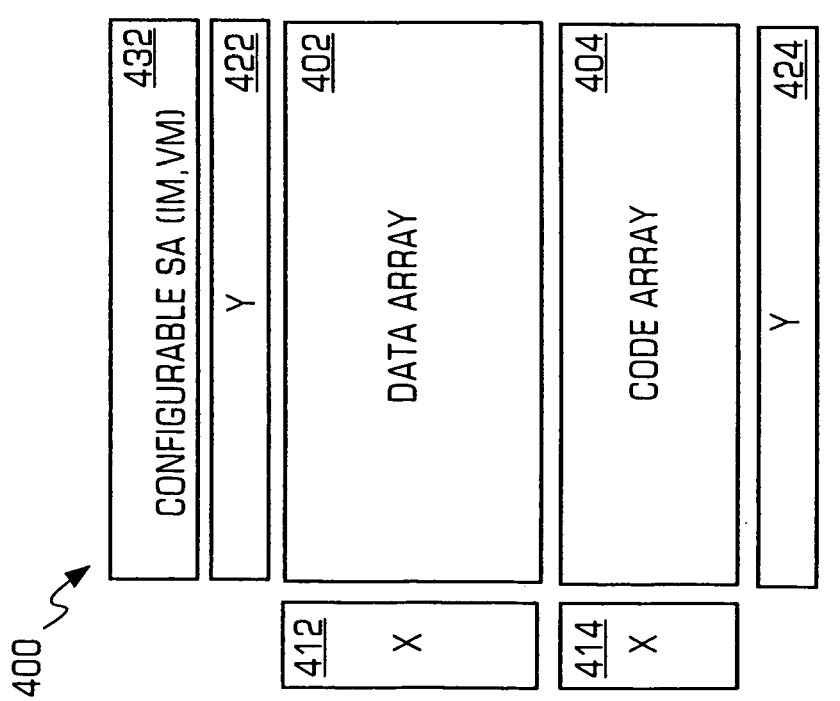
FIG. 4 is a block diagram illustrating a memory array including configurable sensing.

FIG. 4 is a block diagram illustrating a memory array 400 including configurable sensing.

The memory array 400 comprises a data array 402, a code array 404, a plurality of x decoders 412 and 414, a plurality of y decoders 422 and 424, and a configurable sense amplifier 432.

The memory array 400 stores data and code in separate arrays that are controlled by separate x and y decoders. A single configurable sense amplifier 432 detects the content of the selected memory cells in a sensing mode that may be determined by the type of the content. The configurable sense amplifier 432 reads content stored in the data array 402 and the code array 404 using modes selected by the memory controller 202. In one embodiment, the configurable sense amplifier 432 is in a voltage sensing mode to read the data array 402 and in a current sensing mode to read the code array 404. The configurable sense amplifier 432 may be, for example, the sense amplifier 1100 shown in FIG. 11.

The data array 402 and the code array 404 may have the memory cells therein arranged in segments with different sizes depending on content stored therein as described above.

Figure 5:
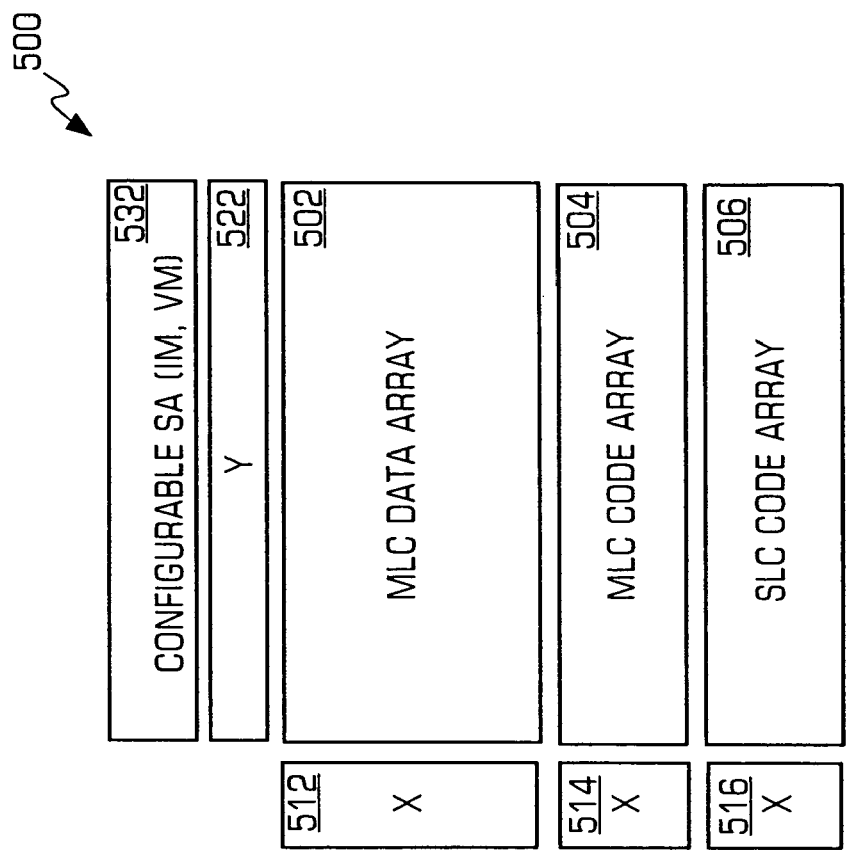
FIG. 5 is a block diagram illustrating a memory array including single level and multilevel memory cells and configurable sensing.

FIG. 5 is a block diagram illustrating a memory array including single level and multilevel memory cells and configurable sensing.

The memory array 500 comprises a multilevel cell data array 502, a multilevel cell code array 504, a single level cell code array 506, a plurality of x decoders 512, 514, 516, a y-decoder 522, and a configurable sense amplifier 532. The memory array 500 stores data and code in separate arrays that are controlled by separate x decoders. A single y decoder selects columns of the selected memory cells. Code may be stored in a single or multilevel format in the respective code array 504 and 506. A single configurable sense amplifier detects the content of the selected memory cells in the sensing mode that may be determined by the type of the content.

Because less voltage reference comparisons are needed, the single level cell code array 506 may provide faster reading than the multilevel cell code array 504. The single level cell code array provides faster programming due to less precision used for the single level, for example by using single or few programming pulses instead of multiple programming pulses. In another embodiment, the memory array 500 may include a single level cell data array (not shown), or a portion of the data array 502 may include single level memory cells.

The configurable sense amplifier 532 reads single level and multilevel memory cells, and code or data. The memory controller 202 selects the sensing mode of the configurable sense amplifier 532. In one embodiment, the configurable sense amplifier 532 is in a voltage sensing mode to read the multilevel cell data array 502 and in a current sensing mode to read the multilevel cell code array 504 or the single level cell code array 506. The configurable sense amplifier 532 may be, for example, the sense amplifier 1100 shown in FIG. 11. As described below, the configurable sense amplifier 532 may provide different bias currents for reading multilevel or single level memory cells to provide faster reading of the single level memory cell. Further, the configurable sense amplifier 532 may provide different bias currents for the type of data such as fast code or slow code being read. For example, a higher bias current may be provided when reading fast code versus lower bias current for slow code so that the reading of the memory cells is faster. The arrays 502, 504 and 506 may be arranged in segments as described above.

Figure 6:
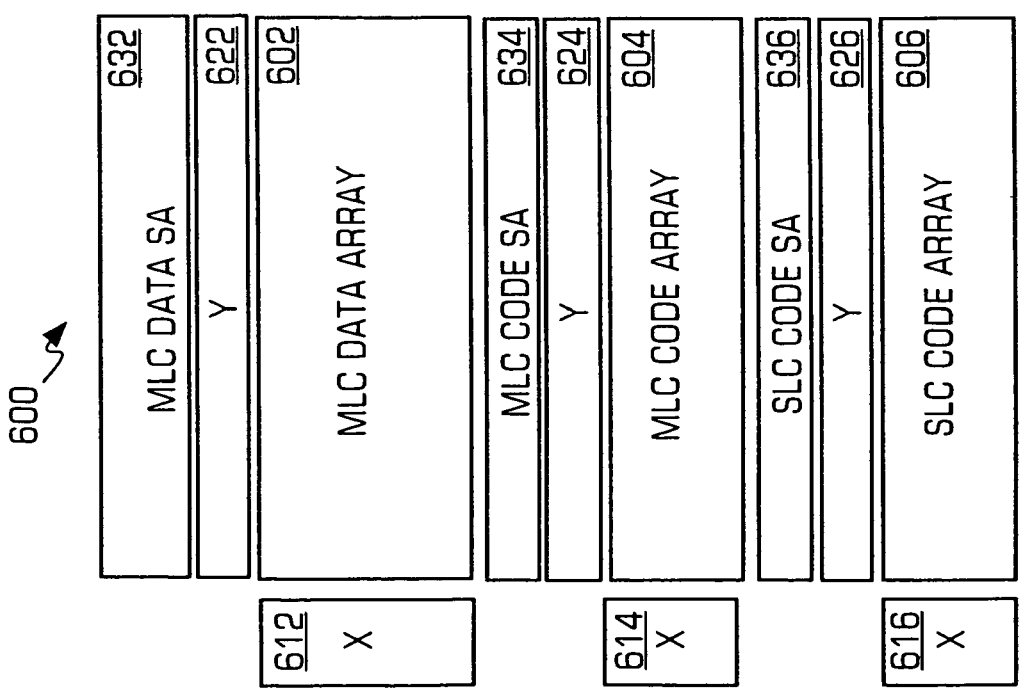
FIG. 6 is a block diagram illustrating a memory array including single level and multilevel memory cells and separate sensing.

FIG. 6 is a block diagram illustrating a memory array 600 including single level and multilevel memory cells and separate sensing.

The memory array 600 comprises a multilevel cell data array 602, a multilevel cell code array 604, a single level cell code array 606, a plurality of x decoders 612, 614, and 616, a plurality of y decoders 622, 624, 626, a multilevel cell data sense amplifier 632, a multilevel cell code sense amplifier 634, and a single level cell code sense amplifier 636. The memory array 600 is similar to the memory array 500 but includes separate y decoders 622, 624, and 634 and separate sense amplifiers 632, 634, and 636. The memory array 600 stores data and code in separate arrays 602, 604, 606 that are controlled by separate respective x decoders 612, 614, 616 and respective y decoders 622, 624, 626. The code may be stored as single level or multilevel content. Separate sense amplifiers 632, 634, 636 detect content of selected memory cells of the separate data and code arrays in a sensing mode that is determined by the type of content. In another embodiment, the memory array 600 may include a single level data array (not shown), or a portion of the data array 602 may include single level memory cells. The array 602, 604, 606 may include memory cells arranged in segments as described above.

Figure 7:
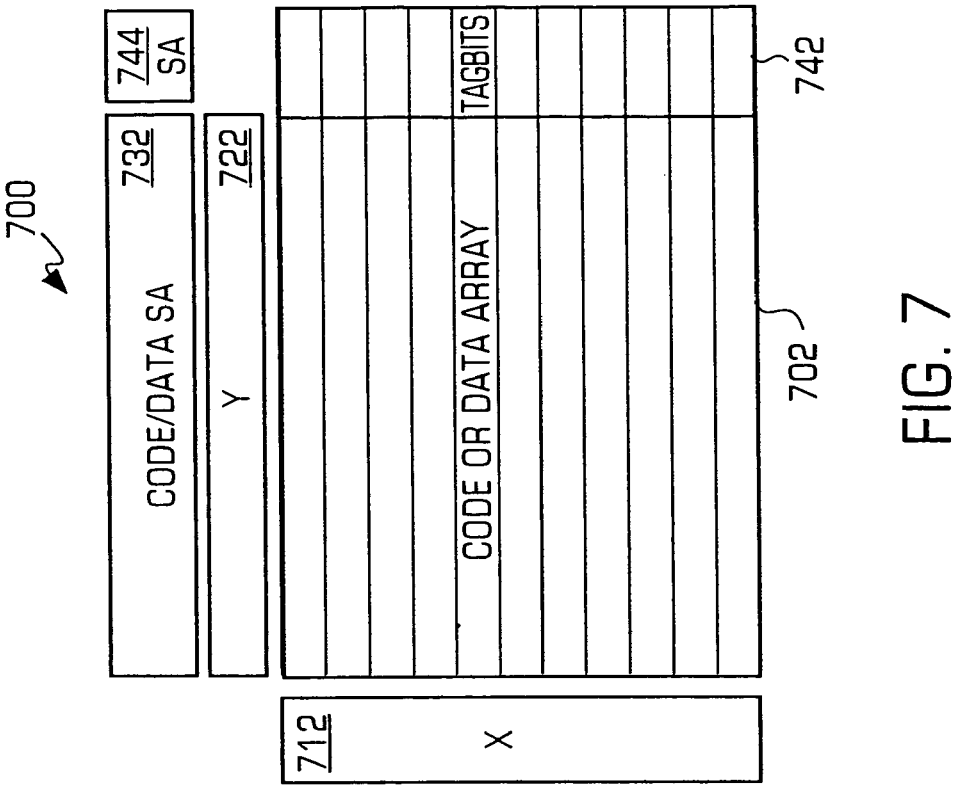
FIG. 7 is a block diagram illustrating a memory array including tag bits.

FIG. 7 is a block diagram illustrating a memory array 700 including tag bits.

The memory array 700 comprises an array 702, an x decoder 712, a y decoder 722, a sense amplifier 732, a tag bit array 742, and a tag bit sense amplifier 744. The memory array 702 may be partitioned into areas for storing content of different characteristics. The characteristics may be the type of content, such as data and code, or the format of content, such as single level and multilevel. The partitioned areas may be in various sizes, such as pages or rows. The partitioning may be predetermined so that only content having a specific characteristic is stored in a corresponding predetermined area, or may be done dynamically as part of memory allocation by the memory controller 202 or as content is stored. The tag bit array 742 stores tag bits indicative of the characteristics of content stored in a corresponding portion of the memory array 702. The sense amplifier 732 is configured based on the characteristics of the content as indicated by the tag bits.

The tag bit array 742 comprises a plurality of cells, such as memory cells, that each stores at least one bit for each corresponding portion of the array 702, such as a row or a page, to indicate the type of content stored in the portion of the array 702. In one embodiment, the tag bit indicates whether the stored content is code or data. Tag bit also indicates whether the stored content is a fast code or slow code. In another embodiment, the tag bit indicates whether the stored content is single level or multilevel. The tag bit array 742 may comprise a plurality of bits for each corresponding portion of the array 702. For example, two tag bits may indicate the type, format or status of content of the corresponding portion of the array 702, in which one of the two tag bits may indicate the type of stored content, such as code or data, and the other tag bit may indicate the storage format, such as single level or multilevel such as N×MLC (1× or 2× or 3× or 4×, with N× indicating $2^N$ level storage cell. The tag bit may indicate the type of communication interface (such as USB or ATA) or the type of 10 interface (such as CMOS or LVDS). In one embodiment, the tag bit array 742 is a separate memory from the array 702. The tag bit array 742 may be volatile such as a latch, SRAM or DRAM, or non-volatile memory such as flash, ROM, or EEPROM. In one embodiment, the tag bit sense amplifier 744 may be part of the sense amplifier 732.

When a portion of the array 702 is selected using the x decoder 712 and the y decoder 722, the tag bit corresponding to the selected portion of the array 702 is read from the tag bit array 742 by the tag bit sense amplifier 744. In response to the type of content indicated by the tag bit, the memory controller 202 (see FIG. 2) configures the sense amplifier 732 for reading the type of content being read from the selected portion of the array 702.

The array memories of FIGS. 3–6 and 8–10 may include a corresponding tag bit array and tag bit sense amplifier.

For memory system 200, a Flash Sector Key may be stored for each sector, for example by tag bits or spare bits, and acts as a security key to enable the access of the memory sector. A sector includes for example 8 rows of memory cells and 8K cells. The sector key is authenticated and authorized by a controlling circuit, for example in real time by the CAM array in FIG. 12 (CAM array and operation are described below). A Flash Security Measure may be stored, for example, by tag bits or spare bits, for each sector. A security measure ensures the security of a memory sector by key authentication and authorization such as by the CAM array. In one embodiment with low security measure, the sector performs blocking or disabling of the memory array. In one embodiment with high security measure, the sector performs a self-destruction sequence after a certain attempt to break in, for example by erasing and/or reprogramming memory data to a different sector.

Figure 8:
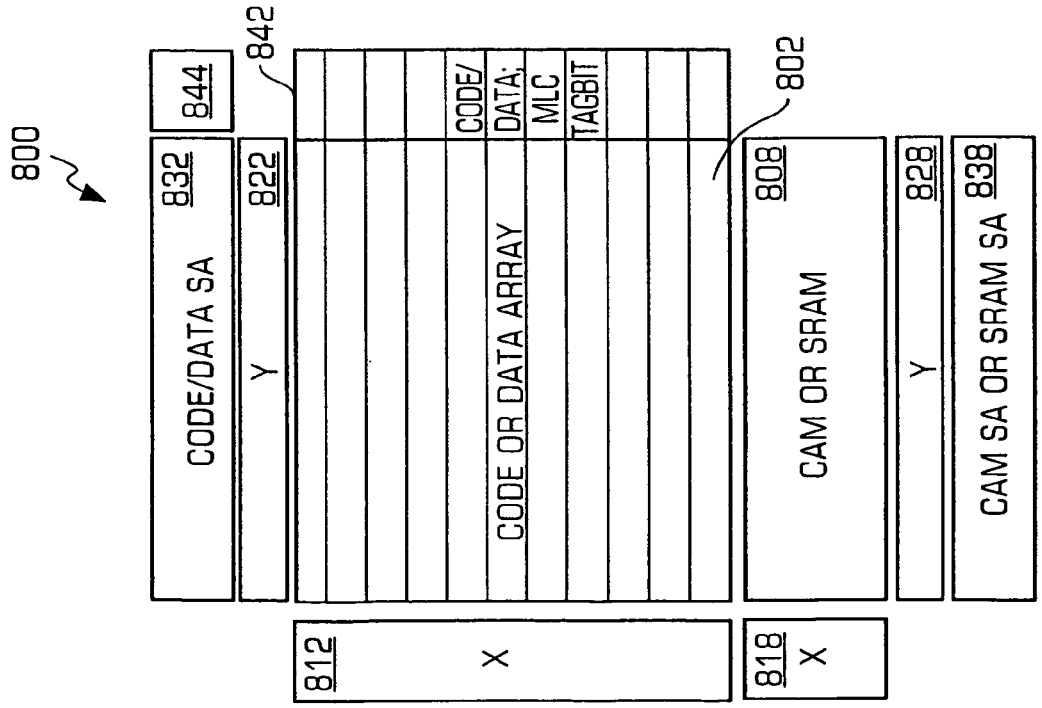
FIG. 8 is a block diagram illustrating a memory array including a content addressable memory.

FIG. 8 is a block diagram illustrating a memory array 800 including an XRAM memory. The XRAM may be SRAM, DRAM, or a content addressable memory (CAM).

The memory array 800 comprises an array 802, a content addressable memory (CAM) or a SRAM 808, a plurality of x decoders 812 and 818, a plurality of y decoders 822 and 828, a plurality of sense amplifiers 832 and 838, a tag bit array, and a tag bit sense amplifier 844.

The array 802 may store code or data or both. The array 802 may include single level memory cells or multilevel memory cells or both. The tag bit array 842 stores tag bits indicative of whether a corresponding portion of the array 802 is code or data or single level or multilevel. The tag bit array 842 may be similar to the tag bit array 742 (FIG. 7).

The content addressable memory 808 may store data for device identification (ID), security ID, encryption keys, digital certificates, memory address scrambling format, classification (classifying the user type and assigning different rule of data access accordingly, e.g., certain ID numbers allowed for certain data such as voice only, secured data only, video only, family only, friends only, work only, adult only, kid only, and the like). These data can be stored permanently from a ROM code or from a flash memory such as a portion of memory 802 and is recalled to be loaded into the memory 808 at power up or in an initialization period. The content addressable memory 808 may be used in applications that use memory pointers to access data. In one embodiment, the comparison speed of the content addressable memory 808 is 100 MHz.

The content addressable memory 808 stores data that is accessed by receiving data that matches at least partially the data stored in the content addressable memory 808. One example of a content addressable memory 808 is the content addressable memory 1200 described below in conjunction with FIG. 12.

The memory 808 may be used to store temporary data, acting as a SRAM data buffer, for memory data manipulation such as cache read or cache programming. In one embodiment, memory data may be recalled from the memory array 802 and temporarily stored in the memory 808 such as for error correction. In one embodiment for data buffering, incoming digital data is stored in chunks in the memory 808 and then the data is programmed into the memory 802 chunk by chunk.

Figure 9:
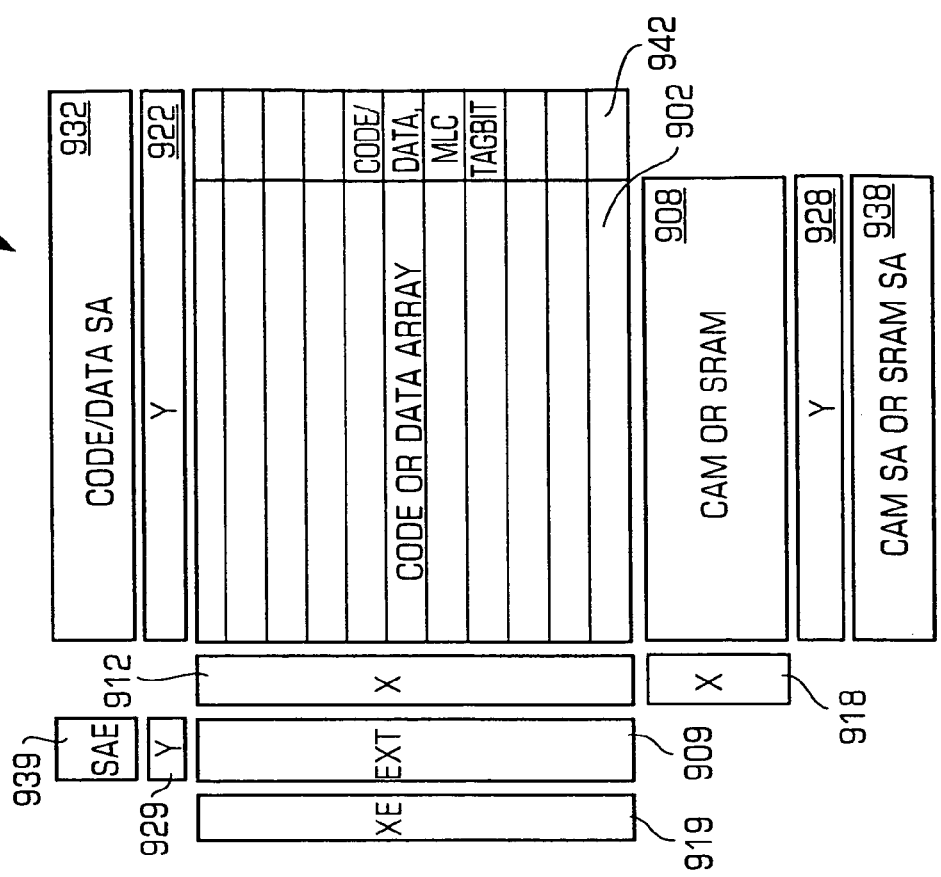
FIG. 9 is a block diagram illustrating a memory array including an extension array.

FIG. 9 is a block diagram illustrating a memory array 900 including an extension array.

The memory array 900 comprises an array 902, a content addressable memory 908, an extension array 909, a plurality of x decoders 912, 918 and 919, a plurality of y decoders 922, 928, and 929, and a plurality of sense amplifiers 932, 938, and 939.

The memory array 900 is similar to the memory array 800 (FIG. 8), but includes an extension array 909, an x decoder 919, and a y decoder 929, and a sense amplifier 939. The extension array 919 may be used for extra data overhead storage, such as error correction or memory management (e.g., status of a selected block of memory being erased or programmed, number of arrays and program cycles used by a selected block, or a number of bad bits in a selected block).

Figure 10:
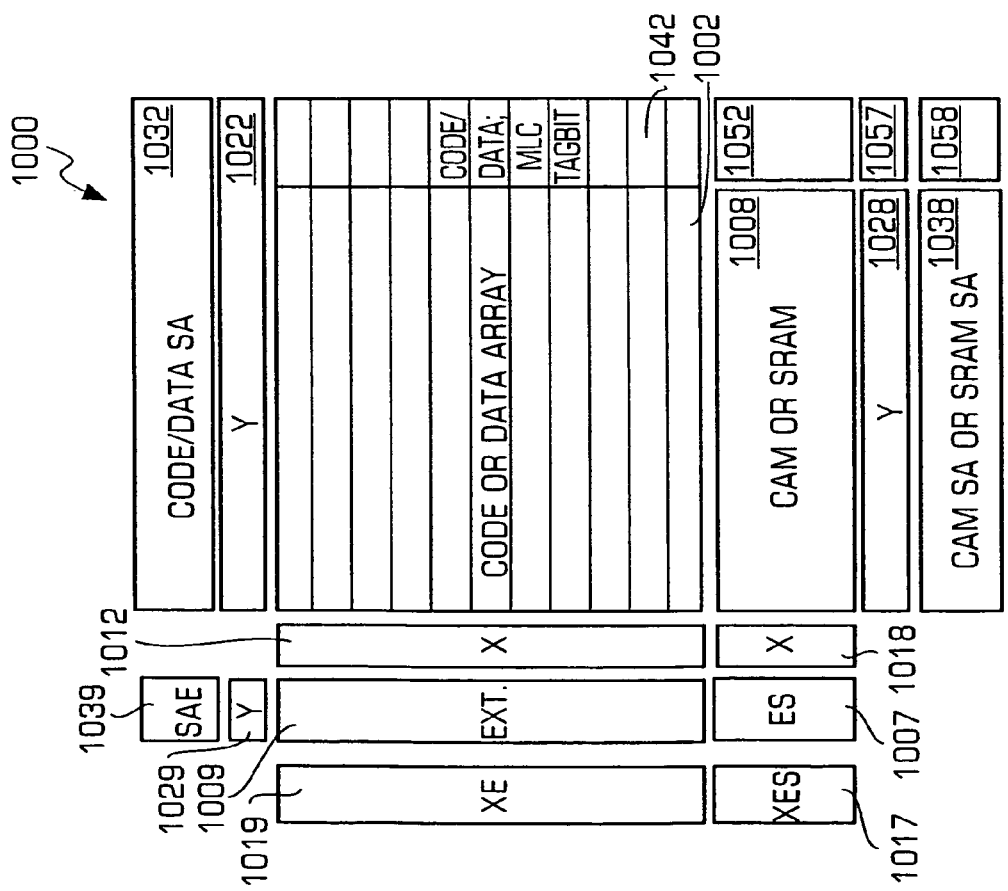
FIG. 10 is a block diagram illustrating a memory array including an extension array for a content addressable memory.

FIG. 10 is a block diagram illustrating a memory array 1000 including an extension array for a content addressable memory.

The memory array 1000 comprises an array 1002, a content addressable memory 1008, extension arrays 1007 and 1009, a plurality of x decoders 1012, 1017, 1018 and 1019, a plurality of y decoders 1022, 1028, 1029, and 1057, a plurality of sense amplifiers 1032, 1038, and 1039, a tag bit array 1052, and a tag bit sense amplifier 1058. The memory array 1000 is similar to the memory array 900, but further includes an extension array 1007 for the content addressable memory 1008 and an extension x decoder 1017 for the extension array 1007. In another embodiment, the extension array for the content addressable memory 1007 may further include a separate y decoder and a separate sense amplifier. The tag bit sense amplifier 1058 senses content of the tag bit array 1052.

Figure 11:
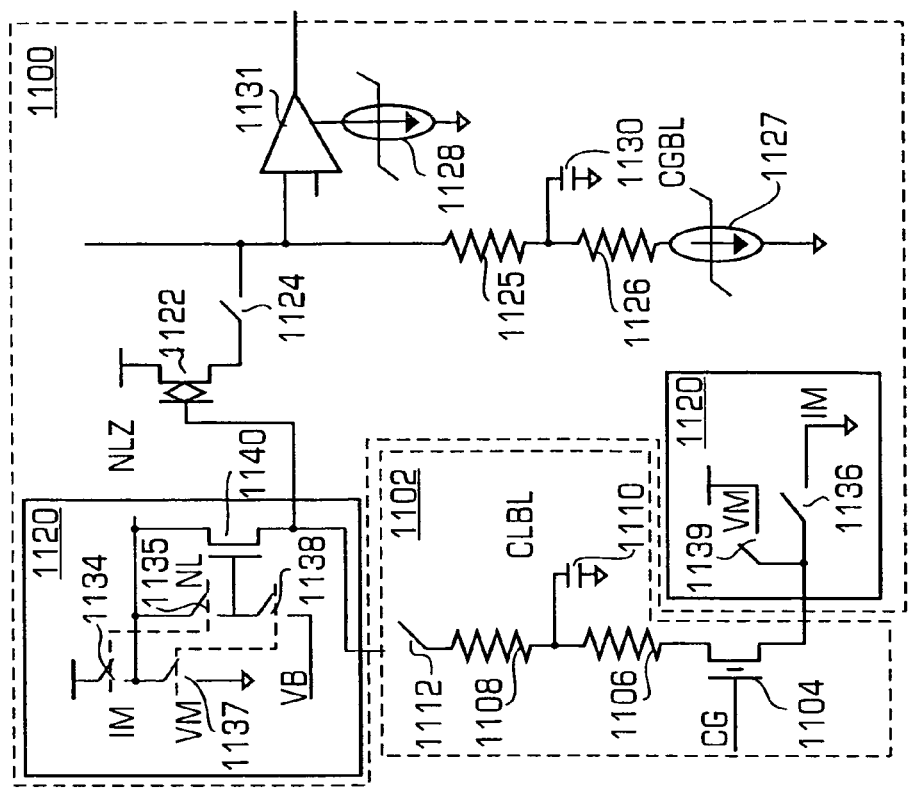
FIG. 11 is a schematic diagram illustrating a configurable sense amplifier.

FIG. 11 is a schematic diagram illustrating a configurable sense amplifier 1100.

The configurable sense amplifier 1100 may be used as the configurable sense amplifiers and tag bit sense amplifiers described above in FIGS. 3–10.

The configurable sense amplifier 1100 senses the contents of a memory array 1102. The memory array 1102 may be one of the memory arrays described above for FIGS. 3–10. For the sake of clarity and simplicity, only a portion of the memory array 1102 is shown. The memory array 1102 comprises a memory cell 1104, resistors 1106 and 1108, a capacitor 1110 and a switch 1112. The resistors 1106 and 1108 are shown schematically and indicate the resistance of the bitline. The capacitor 1110 is the parasitic capacitance on a bitline from the memory cell 1104 to the configurable sense amplifier 1100. The switch 1112 is controlled by a corresponding y driver that selects the bitline, and switches selected memory cells 1104 to the configurable sense amplifier 1100. The sensing mode configuration circuit 1120 forms a first stage and the NMOS transistor 1122, resistors 1125 and 1126, and the current source 1127 form a second stage of the configurable sense amplifier 1100. The second stage is configured as a source follower stage. In another embodiment, the second stage is a common source stage. The second stage is used for example to drive the global bitlines of memory array.

The configurable sense amplifier 1100 comprises a sensing mode configuration circuit 1120, an NLZ (native) NMOS transistor 1122, a switch 1124, a plurality of resistors 1125 and 1126, a plurality of current sources 1127 and 1128, a capacitor 1130, and comparator 1131.

As is described in more detail below, the sensing mode configuration circuit 1120 sets the sensing mode for reading the contents of the memory cell 1104. The resulting detected voltage is applied to the gate of the NLZ transistor 1122, which is configured as a source follower. The current source 1127 provides a bias current for the NLZ transistor 1122 when switched in by the switch 1124, and the resistors 1125 and 1126. The comparator 1131 is biased by a current bias 1128. The comparator 1131 compares the detected voltage from the source follower transistor 1122 to a reference voltage.

The sensing mode configuration circuit 1120 comprises a plurality of switches 1134 through 1139 and a transistor 1140. The NL transistor 1140 is switched to function as a load during current mode sensing and as a current source during voltage mode sensing. In current mode sensing, the switches 1134,1135, and 1136 are closed and the switches 1137, 1138, and 1139 are open. In the voltage sensing mode, the switches 1137, 1138, and 1139 are closed, and the switches 1134, 1135, and 1136 are open. The bias current of the current sources 1127 and 1128 may be adjusted for the type of data stored in the memory cell. For example, when sensing data, the bias current may be small, and for sensing slow code the bias current may be intermediate and for sensing fast code the bias current may be large. Reading code typically is fast and a large sensing current may be selected.

Figure 12:
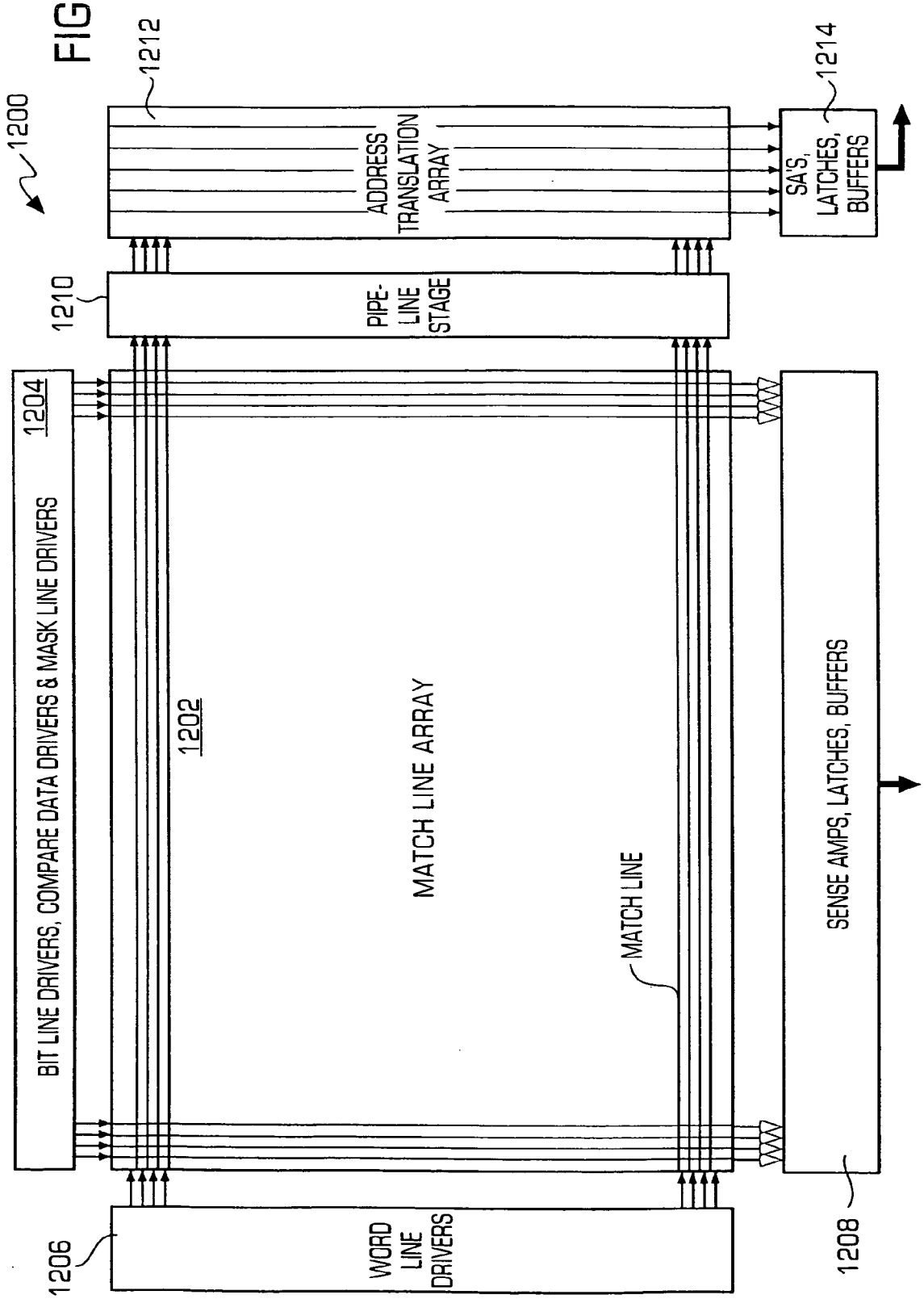
FIG. 12 is a block diagram illustrating a content addressable memory.

FIG. 12 is a block diagram illustrating a content addressable memory 1200.

The content addressable memory 1200 may be used as the content addressable memories 808, 908, and 1008 of FIGS. 8–10, respectively. The content addressable memory 1200 comprises a match line array 1202, a driver array 1204, a word line driver array 1206, a sense amplifier array 1208, a pipeline stage 1210, an address translation array 1212, and output stage 1214.

Figure 13:
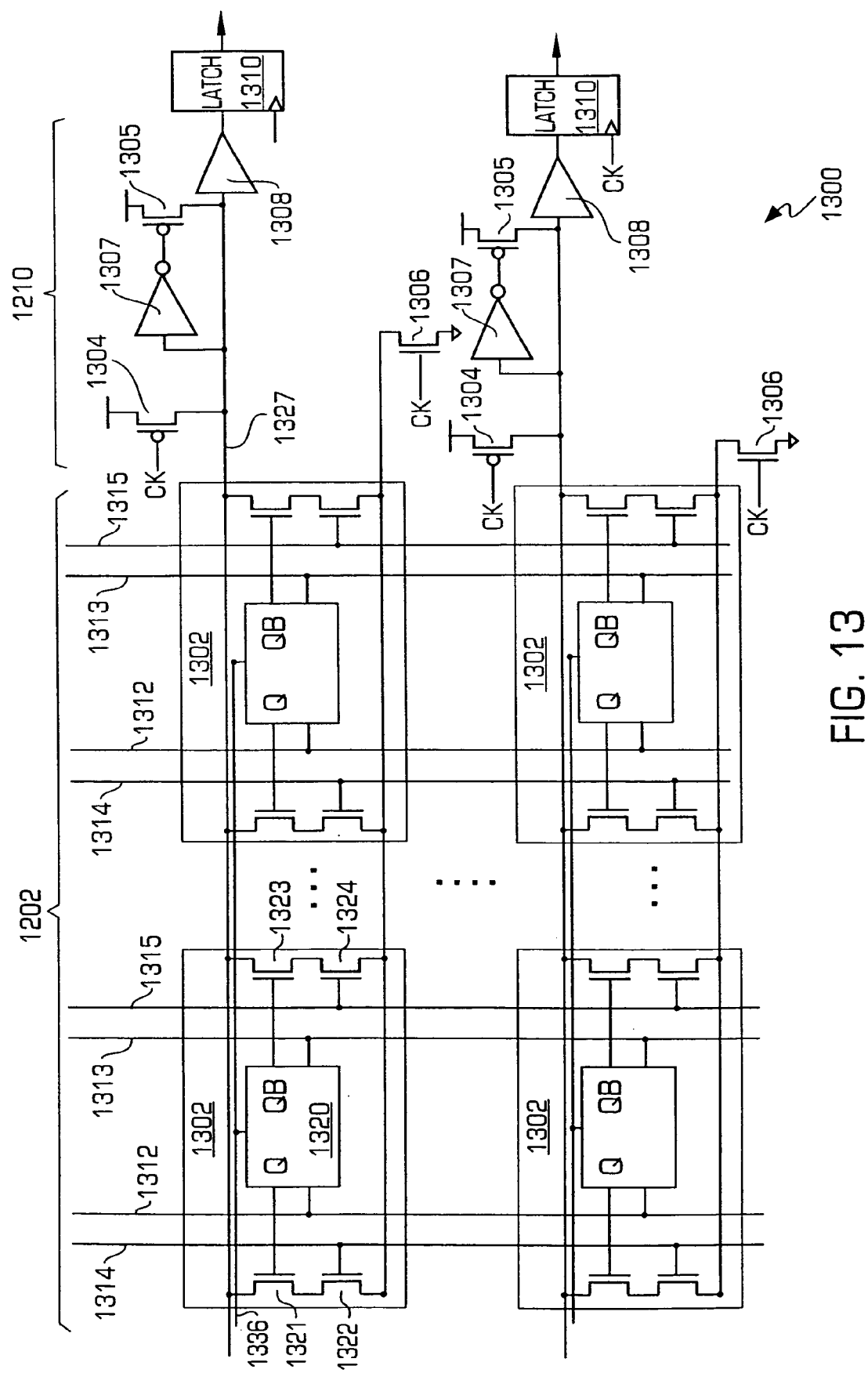
FIG. 13 is a schematic diagram illustrating a binary cell content addressable memory.
Figure 14:
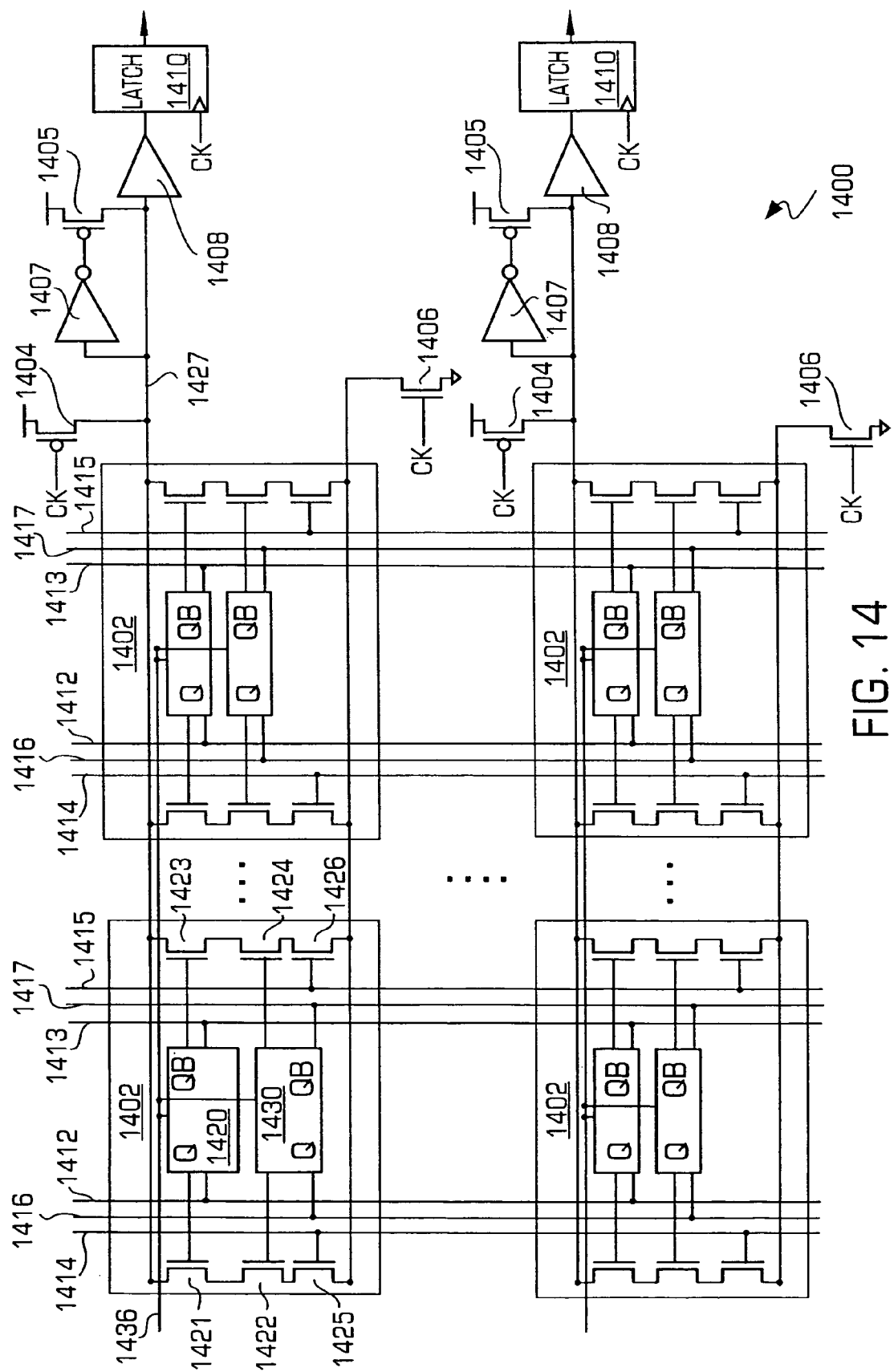
FIG. 14 is a schematic diagram illustrating a ternary cell content addressable memory.

In one embodiment, the match line array 1202 includes an array of binary CAM cells (FIG. 13). In another embodiment, the match line array 1202 includes an array of ternary CAM cells (FIG. 14). In one embodiment, the match line array 1202 is 64 to 1024 bits wide depending on application and 1024 rows.

The operation of the content addressable memory 1202 is described below in conjunction with FIGS. 13 and 14.

FIG. 13 is a block diagram illustrating the match line array 1202 and the pipeline stage 1210 for a binary CAM cell system.

The match line array 1202 comprises a plurality of cell circuits 1302, and a plurality of NMOS transistors 1306. The cell circuits 1302 comprise a memory cell 1320, and a plurality of NMOS pulldown transistors 1321 through 1324. In one embodiment, the memory cell 1320 comprises an SRAM cell. In another embodiment, the memory cell 1320 comprises a PSRAM (pseudo SRAM, e.g., using a DRAM cell with hidden refresh to simulate SRAM). The pulldown transistors 1321 through 1324 operate to discharge a match line 1327 whenever there is a single data bit mismatch. A bitline 1312 and an inverted bitline 1313 couple columns of the memory cells 1320 for reading and writing of the memory cells 1320. The output and inverted output of the memory cell 1320 are coupled to the gates of the respective NMOS transistors 1321 and 1323. A COMPARE data line 1315 and an inverted COMPARE data line 1314 are coupled to the gates of the NMOS transistors 1324 and 1322, respectively, to enable the transistors. The sources of the NMOS transistors 1322 and 1324 are coupled to the drain of the NMOS transistor 1306 which is coupled to ground in response to a clock signal applied to a gate thereof. A word line 1336 enables the memory cells 1320. A match line 1327 is coupled to the drains of the NMOS transistors 1321 and 1323 and to the pipeline stage 1210.

The transistor 1306 functions as a virtual ground pulldown transistor to pull down the match line 1327 to a virtual ground after all compared data is valid and the precharge event is completed.

The pipeline stage 1210 comprises PMOS transistors 1304 and 1305, an inverter 1307, a buffer 1308, and a latch 1310. The pipeline stage 1210 captures the state of the match line 1327 after a match event is over. The latch 1310 may be an edge triggered flipflop or a level triggered latch. The PMOS transistor 1304 operates as a precharge transistor to precharge the match lines 1327 in response to a clock signal. The inverter 1307 and the PMOS transistor 1305 form a keeper circuit to keep or hold the charge on the match lines 1327 after the precharge event ends.

The driver array 1204 includes bit line drivers to drive bit lines (1312, 1313) to write data to the cells 1320. The driver array 1204 also includes compare data drivers to drive the data bits for comparison. The sense amplifier array 1208 may include sense amplifiers, latches and buffers for reading the data stored in the match line array 1202.

The word line drivers 1206 enable rows of the CAM memory cells 1302. Bitline drivers of the driver array 1204 drive the bitlines 1312 and the inverted bitlines 1313 to write data to the memory cells 1302. The compare data drivers of the driver array 1204 drive the corresponding compare data line 1315 and the inverted compare data line 1314 to enable the transistors 1324 and 1322, respectively, for determining whether there is a match. When a match event occurs, the memory cell 1320 enables the corresponding transistor 1321 or 1323 to hold the match line 1327 to virtual ground or up to supply voltage as precharged by the precharge transistor 1304.

The sense amplifiers 1208 which may include latches and buffers, and read the data stored in the SRAM array 1302. The address translation array 1212 translates the physical location of the selected match line from the content addressable memory array 1202 to an appropriate pointer address of the memory. The address translation sense amplifiers 1214, which may include latches and buffers, read the address data from the address translator array 1212.

FIG. 14 is a block diagram illustrating the match line array 1202 and the pipeline stage 1210 for a ternary CAM cell system.

The match line 1202 comprises a plurality of cell circuits 1402, and a plurality of NMOS transistors 1406. The cell circuits 1402 comprise memory cells 1420 and 1430, and a plurality of pulldown NMOS transistors 1421 through 1426. The memory cells 1420 store data that is to be compared against incoming data. The memory cell 1430 stores a mask bit to indicate whether the comparison data is to be masked, so that no comparison is made. In one embodiment, the memory cells 1420 and 1430 are SRAM cells. The transistors 1421 through 1426 provide two sets of three pulldown transistors in series to pull down a match line 1427 whenever there is a mismatch between stored data and comparison data provided that the particular bit is not masked. A bitline 1412 and an inverted bitline 1413 couple columns of the memory cells 1420 for reading and writing in memory cells 1420. The output and inverted output of the memory cell 1420 is coupled to the gates of the respective NMOS transistors 1421 and 1423. A compare data line 1415 and an inverted compare data line 1414 are coupled to the NMOS transistors 1425 and 1426, respectively, to enable the transistors. A match line 1416 and an inverted match line 1417 couple columns of the memory cells 1430 for reading and writing of the memory cells 1430 which stored the mask bit. The output and inverted output of the memory cell 1430 are coupled to the gates of the NMOS transistors 1422 and 1424, respectively, to enable the transistors. The sources of the NMOS transistors 1425 and 1426 are coupled to drain of the NMOS transistor 1406 which is coupled to ground in response to a clock signal applied to a gate thereof. A word line 1436 enables the memory cells 1420 and 1430. The match line 1427 is coupled to the drains of the NMOS transistors 1421 and 1423 and to the pipeline stage 1210.

The transistor 1406 functions as a virtual pulldown ground transistor to pull down the match line 1417 for virtual ground after all compare data is valid and the precharge event is completed.

The pipeline stage 1210 comprises PMOS transistors 1404 and 1405, an inverter 1407, a buffer 1408, and a latch 1410. The pipeline stage 1410 captures the state of the matched line 1417 after a match event is over. The latch 1410 may be an edge triggered flipflop or a level triggered latch. The PMOS transistor 1404 operates as a precharge transistor to precharge the match line 1417 in response to a clock signal. The inverter 1407 and the PMOS transistor 1405 form a keeper circuit to keep or hold the charge on the match line 1417 after the precharge event ends.

The operation of the content addressable memory 1200 is now described. First data is loaded, for example, from a read-only memory (ROM) or flash chip into the CAM memory cells 1302 by serially loading into the bitline drivers of the driver array 1204. The bitline drivers then drive the data along the bitlines 1312 and 1313 into a selected row selected by the word line 1336. The data loading sequence is repeated to fill up the match line array 1202. The sense amplifier array 1208 senses and latches the data from the CAM memory cells 1302, for example to verify or test the CAM cell data.

An input data stream of an incoming N bits, e.g., 64 bits, is then compared versus the data that is stored in the match line array 1202 as follows. The N bits of the input data stream is first loaded into the compare data drivers of the driver array 1204. The compare data drivers then drive the data onto the compare data lines 1313 and 1314. The data comparison is then enabled (e.g., a transition of the clock (CK) from low to high, a clock (CK) low to precharge all the match lines 1327). The comparison result, done for the whole array at the same cycle appears on the match lines 1327 and is sensed by the match line sensing and buffering circuit of the sense amplifier array 1208. The result is then latched into the pipeline stage at 1210, which is then applied to the address translation array 1212. The latched output is, for example, pointers, microcode, or control lines.

For a ternary content addressable memory of FIG. 14, the operation is similar except the mask data stored in the mask memory cell 1430. As part of the loading operation, the mask line drivers of the driver array 1204 load data into the mask bit memory cells 1430. The mask data enables or disables the data comparison for the selected CAM memory cell 1420:

The memory cells 1320,1420, and 1430 may be volatile memory. In one embodiment, the memory cells 1320,1420, and 1430 may be pseudo-SRAM (PSRAM) memory cells, in which the pseudo-SRAM uses a DRAM cell for the SRAM function to reduce die size. In another, embodiment, a PSRAM cell may use a multilevel memory cell by modulating the amplitude of voltage stored in the capacitor such as modulating the voltage level on a pass gate (e.g., voltage on the word line) to the capacitor to store different voltage levels, e.g., 0.2V, 0.4V, 0.8V for a 2-bit PSRAM multilevel cell, on the capacitor. In this case additional control and decoding circuitry (not shown) extracts and manipulates digital bits out of the multilevel PSRAM cell or additional analog multilevel circuitry manipulates directly the stored analog level.

Referring again to FIG. 2, the memory subsystems 204 may be accessed to a parallel, concurrent or pipelined operation among memory subsystems 204. A portion of a first memory subsystem 204 may be accessed for operations such as program, erase, read, or verify while at the same time another memory subsystem 204 is enabled to be accessed concurrently for another operation, such as program, erase, read, or verify. During operations in which the contents of the memory cells must be sent, the memory subsystems 204 are placed in the appropriate sensing mode.

As an illustrative example, a first memory subsystem 204 may store code while a second memory subsystem 204 also stores code. While the first memory subsystem 204 is being programmed, erased or read, the second memory subsystem 204 may be programmed, erased or read.

In another illustrative example, a first memory subsystem 204 may store code while a second memory subsystem 204 stores data. While code is being programmed, erased or read from the first memory subsystem 204, data may be programmed, erased or read from the second memory subsystem 204.

In another illustrative embodiment, data may be stored in first and second memory subsystems 204. While data is being programmed, erased or read from the first memory subsystem 204, data may be programmed, erased or read from the second memory subsystem 204.

In another illustrative embodiment, a first memory subsystem 204 includes either an SRAM or a content addressable memory while a second memory subsystem 204 stores a data or code. While the SRAM or content addressable memory is being written or read in the first memory subsystem, data or code may be programmed, erased or read from the second memory subsystem 204.

In one embodiment for concurrent memory operations, each memory subsystem 204 includes appropriate control circuits associated with decoding, sensing, writing and latching for the desired operations.

In one embodiment, the memory cells may be verified and read in different sensing modes. For example, the memory cell may be verified by placing a memory cell in a voltage mode while reading of the memory cell may be done in a current sensing mode.

The memory subsystems and memory arrays described herein may be multichip or monolithic.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A configurable sense amplifier comprising:
   a comparator having a first input coupled to a gate reference voltage terminal, having a second input coupled to a detected voltage terminal and having an output for generating an output signal indicative of the comparison between voltages applied to the first and second terminals; and
   a configurable detection circuit coupled to the detected voltage terminal to provide a voltage indicative of content in a selected memory cell, the configurable detection circuit providing said voltage in both a voltage sensing mode and in a current sensing mode.

2. The configurable sense amplifier of claim 1 wherein the sensing mode configuration circuit provides an adjustable bias to the voltage terminal that is dependent on sensing mode.

3. The configurable sense amplifier of claim 1 further comprising a second buffer/gain stage.

4. The configurable sense amplifier of claim 3 wherein the second buffer/gain stage includes an adjustable bias.

5. The configurable sense amplifier of claim 4 wherein the comparator includes an adjustable bias.

6. The configurable sense amplifier of claim 1 further comprising a second buffer/gain stage that is a source follower.

7. The configurable sense amplifier of claim 1 further comprising a comparator stage.

* * * * *